United States Patent [19]
Celii et al.

[11] Patent Number: 5,399,521
[45] Date of Patent: Mar. 21, 1995

[54] METHOD OF SEMICONDUCTOR LAYER GROWTH BY MBE

[75] Inventors: Francis G. Celii; Yung-Chung Kao, both of Dallas; Andrew J. Purdes, Garland, all of Tex.

[73] Assignee: Texas Instruments Incorporated, Dallas, Tex.

[21] Appl. No.: 133,699

[22] Filed: Oct. 8, 1993

[51] Int. Cl.$^6$ .................................. H01L 21/203
[52] U.S. Cl. .................... 437/105; 437/107; 437/126; 437/133; 117/84; 117/85; 117/86
[58] Field of Search .............. 437/105, 107, 126, 133; 156/601; 117/84, 85, 86

[56] References Cited

U.S. PATENT DOCUMENTS 5,091,320 2/1992 Aspnes et al. .............. 156/601
5,179,399 12/1992 Brennan et al. .............. 156/601

FOREIGN PATENT DOCUMENTS 4043631 2/1992 Japan .................................. 437/107

OTHER PUBLICATIONS

Brennan et al. in "Application of reflection mass spectrometry to molecular beam Epitaxial growth of InAlAs and IaGaAs" in J. Vac. Sci. Technol. B7(2), Mar./Apr. 1987 pp. 277-282.

Primary Examiner—R. Bruce Breneman
Assistant Examiner—Ramamohan Rao Paladugu
Attorney, Agent, or Firm—W. Daniel Swayze, Jr.; Leo N. Heiting; Richard L. Donaldson

[57] ABSTRACT

Molecular beam epitaxy (202) with growing layer thickness control (206) by feedback of integrated mass spectormeter (204) signals. Examples include III-V compound structures with multiple AlAs, InGaAs, and InAs layers as used in resonant tunneling diodes.

11 Claims, 4 Drawing Sheets

METHOD OF SEMICONDUCTOR LAYER GROWTH BY MBE

CROSS-REFERENCE TO RELATED APPLICATIONS

The following U.S. Patent application discloses related subject matter and has a common assignee with this application: Ser. No. 07/958,888, filed Oct. 9, 1992.

BACKGROUND OF THE INVENTION

The invention relates to electronic devices, and, more particularly, to fabrication methods for semiconductors.

The continual demand for enhanced transistor and integrated circuit performance has resulted in improvements in existing devices, such as silicon bipolar and CMOS transistors and gallium arsenide MESFETs, and also the introduction of new device types and materials. In particular, the demand for low noise and high power at microwave frequencies has led to high electron mobility transistors (HEMTs) made of combinations of gallium arsenide (GaAs) plus aluminum gallium arsenide ($Al_xGa_{1-x}As$) and pseudomomrphic HEMTs made of combinations of $Al_xGa_{1-x}As$ and indium gallium arsenide ($In_xGa_{1-x}As$) in a MESFET-like structure. Similarly, heterojunction bipolar transistors (HBTs) made of wide bandgap emitters with narrow bandgap bases (e.g., $Al_xGa_{1-x}As$ emitters with GaAs bases or silicon emitters with silicon-germanium bases) overcome the all-silicon bipolar transistor limitation on base doping levels due to carrier injection into the emitter.

Further, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena. For example, Mars et al., Reproducible Growth and Application of AlAs/GaAs Double Barrier Resonant Tunneling Diodes, 11 J. Vac. Sci. Tech. B 965 (1993), and Özbay et al, 110-GHz Monolithic Resonant-Tunneling-Diode Trigger Circuit, 12 IEEE Elec. Dev. Lett. 480 (1991), each use two AlAs tunneling barriers imbedded in a GaAs structure to form a quantum well resonant tunneling diode. The quantum well may be 4.5 nm thick with 1.7 nm thick tunneling barriers. Resonant tunneling transistors improve upon resonant tunneling diodes by providing gain and come in a variety of types. In particular, HBTs and hot electron transistors (HETs) with one or more double barrier quantum well energy filters located in their emitters yield resonant tunneling bipolar transistors (RTBTs) and resonant tunneling hot electron transistors (RHETs), respectively. Futatsugi et al, Resonant Tunneling Bipolar Transistors Using InAlAs/InGaAs Heterostructures, 65 J. Appl. Phys. 1771 (1989), describes the characteristics of an RTBT.

The foregoing devices all require structures with sharp heterojunctions and the resonant tunneling devices futher require multiple thin (~2 nm thick) compound semiconductor layers. Molecular beam epitaxy (MBE) provides the typical fabrication method for such structures.

FIG. 1 heuristically illustrates a simple MBE system 100 which includes a high vacuum chamber 102 with a rotating wafer holder 104 and effusion cells 106 aimed at the wafer holder, plus various optional detector systems such as reflection high energy electron diffraction (RHEED) 110–111, ellipsometry 112–113, and line-of-sight in situ reflection mass spectrometer (REMS) 115. Wafers are typically circular with two-inch or three-inch diameter and 0.5 mm thickness. Wafer holder 104 includes a heater and thermocouple to control the temperature of wafer 120, typically in the range of 400° to 700° C. The pump maintains chamber 102 at a very low pressure, typically on the order of $5 \times 10^{-9}$ torr during growth. This pressure implies atoms and molecules have a mean free path larger than the diameter of chamber 102.

Basically, the operation of MBE system 100 to grow layers on wafer 120 is as follows. First, charge effusion cells 106 with quantifies of the species required to grow the desired layers on wafer 120; for example, one effusion cell may contain aluminum (Al), another gallium (Ga), a third indium (In), and a fourth arsenic (As). This would suffice to grow layers of compound semiconductors such as GaAs, $In_xGa_{1-x}As$, AlAs, $Al_xGa_{1-x}As$, and so forth. Then to grow a layer of GaAs, the shutters of the gallium and the arsenic effusion cells are opened and beams of gallium and arsenic (perhaps in the form of $As_2$ or $As_4$) impinge on wafer 120. Ideally, the atoms/molecules of the impinging Ga and As beams stick to and migrate on the surface of wafer 120 and react to form GaAs. Due to the volatility of aresenic, an arsenic overpressure is maintained to deter decomposition of the growing arsenic compounds. Thus the arsenic beam may have a flux a thousand times that of the gallium, aluminum, or indium beams.

The detector systems such as RHEED permit (for a nonrotating wafer) assessment of the crystal quality and growth rate of the surface layer of wafer 120, and ellipsometry allows layer thickness measurements. REMS permits evaluation of the sticking coefficient and desorption of one of the elements as a function of temperature. See Brennan et al, Application of Reflection Mass Spectrometry to Molecular-Beam Epitaxial Growth of InAlAs and InGaAs, 7 J. Vax. Sci. Tech. B 277 (1989); Brennan et al, U.S. Pat. No. 5,171,399; and Brennan et al, Reactive Sticking of $As_4$ during Molecular Beam Homoepitaxy of GaAs, AlAs, and InAs, 10 J. Vac. Sci. Tech. A 33 (1992). Also, see U.S. Pat. No. 5,096,533.

However, MBE growth of layers has problems including accurate control of layer thickness. The typical growth procedure determines average growth rates, and then synchronizes the opening and closing of effusion cell shutters to give nominal layer thicknesses based on the average growth rates. Because average growth rates are often determined with thick-layer growths and post-growth analysis, extrapolation of these results to growth of thin layers can result in large deviations from nominal thickness values. The true layer thickness can also differ from the nominal due to fluctuations in effusion cell flux or change in growth conditions such as wafer surface temperature. A method is needed for accurate determination of growth rate during layer deposition, such that layer thickness can be precisely controlled.

SUMMARY OF THE INVENTION

The present invention provides MBE growing layer thickness control by feedback from measurements of the reflected flux of growth species.

BRIEF DESCRIPTION OF THE DRAWINGS

The drawings are schematic for clarity.

DESCRIPTION OF THE PREFERRED EMBODIMENTS

Overview

Figure 1:
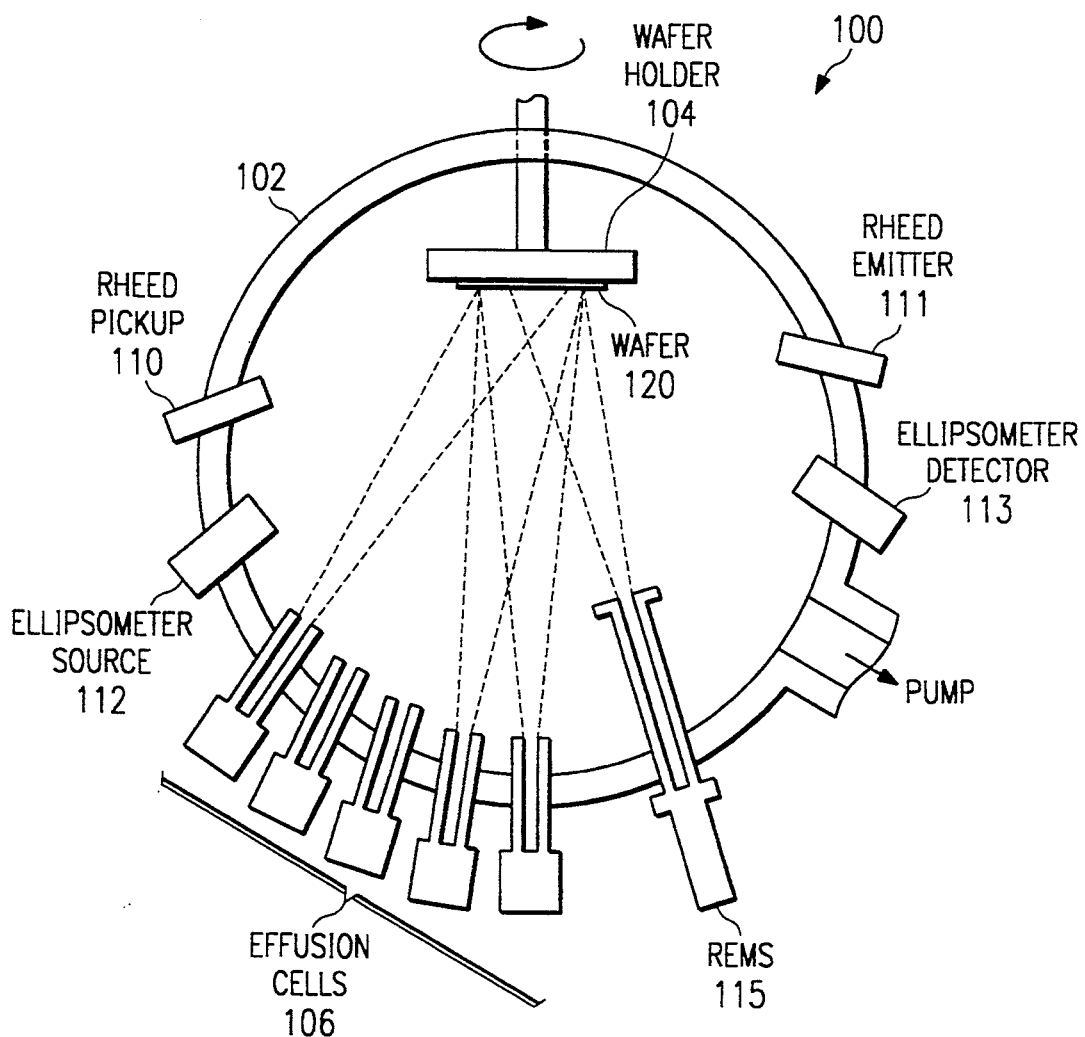
FIG. 1 heuristically shows a known MBE machine.
Figure 2:
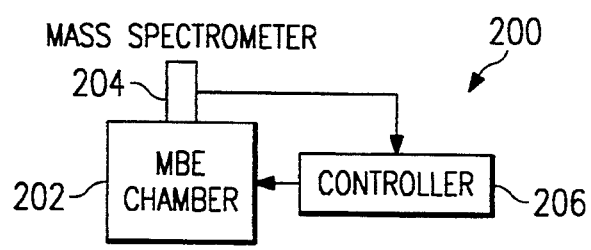
FIG. 2 shows in block diagram first preferred embodiment.

FIG. 2 shows in block format first preferred embodiment MBE system, generally denoted by reference numeral 200, as including MBE growth chamber 202 with mass spectrometer 204 and controller 206 which drives the molecular beam effusion cells. MBE chamber 202 and mass spectrometer 204 may have the structure as shown in FIG. 1. Controller 206 may include a personal computer (PC) programmed to control the effusion cell shutters in response to computations performed on the output signals of mass spectrometer 204. Mass spectrometer 204 output signals indicaate the amount of each element impinging on the wafer in MBE chamber 202, and thus integrating the signals over time permits determination of instantaneous layer thickness as the layer is growing. The time delay due to performing such signal integration is negligible with respect to the time taken to grow even a thin layer; hence, a real time feedback control of layer thicknesses can be achieved. Thus controller 206 may be programmed to grow a multilayer structure with set layer thicknesses, and the effusion cell control derives from actual layer thickness via the mass spectrometer signal feedback rather that from a timed growth. This avoids the problem of using an average growth rate for all thickness layers despite possibly nonuniform growth rates.

The same feedback real time control may also be achieved in other types of MBE systems. For example, the MBE chamber may be a metalorganic MBE (MOMBE) chamber with controller 206 driving metalorganic gas mass controllers rather than effusion cells. Controller 206 could also control the temperature of the wafer in MBE chamber 202 and the total pressure for more complex growth programs.

First Preferred Embodiment Method

Figure 3:
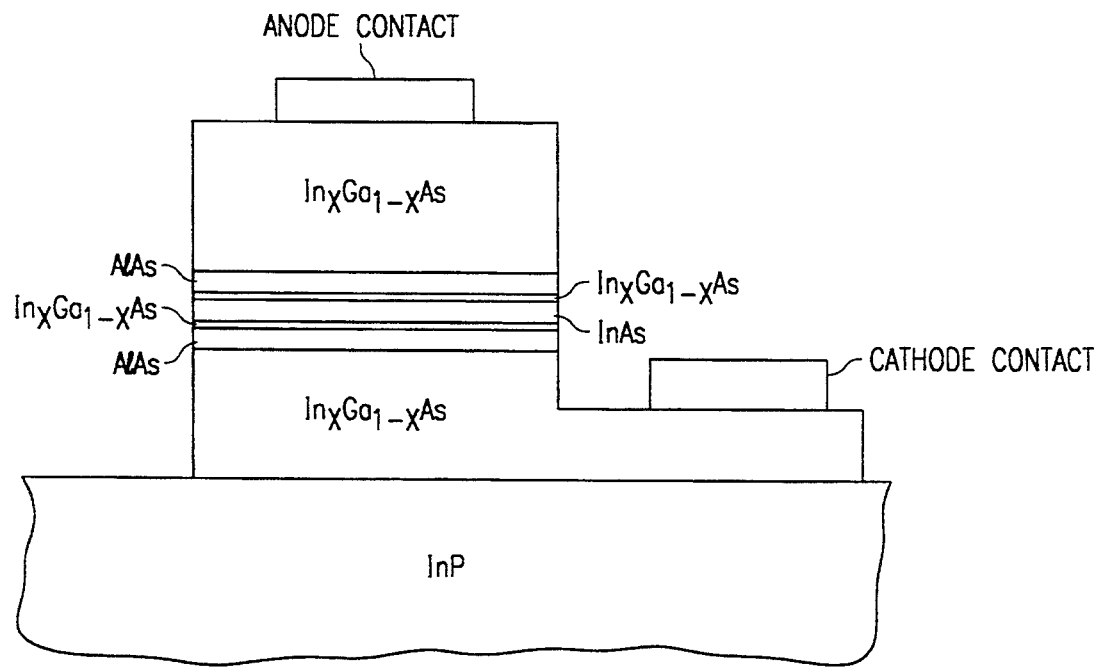
FIG. 3 illustrates a resonant tunneling diode.

The first preferred embodiment method of MBE growth will be explained through the example of growing the $In_xGa_{1-x}As$, AlAs, and InAs layers needed to fabricate the resonant tunneling diode schematically illustrated in cross sectional elevation view in FIG. 3. MBE system 200 will be used. The method then includes the following steps.

(a) Mount a two-inch diameter indium phosphide (InP) wafer in the wafer holder in chamber 202. Then evacuate chamber 202 and clean (desorb native oxide) the InP wafer. Also, load controller 206 with desired thicknesses of the successive layers to be grown. In this example the layers and thicknesses are in order of growth (x=0.53):

| | |
|---|---|
| $In_xGa_{1-x}As$ | 50 nm |
| AlAs | 2 nm |
| $In_xGa_{1-x}As$ | 0.5 nm |
| InAs | 4 nm |
| $In_xGa_{1-x}As$ | 0.5 nm |
| AlAs | 2 nm |
| $In_xGa_{1-x}As$ | 80 nm |

Note that the InAs will be a strained layer quantum well clad with InGaAs. Next, load effusion cells with indium, gallium, aluminum, and arsenic. Also, if the top and bottom layers are to be doped to lower the resistivity, then load an effusion cell with silicon for n-type in situ doping growth. Lastly, set mass spectrometer 204 to detect $In^{115}$, $Ga^{70}$, $Al^{27}$, and $As^{75}$ and time multiplex the signals to feed a single port of controller 206. These signals basically consist of analog measurements of currents on the order of $10^{-11}$ amps, and an analog-to-digital converter puts these analog mesaurements into digital format for numerical integration by controller 206.

(b) Heat the InP wafer to 450° C. and maintain this growth temperature throughout. Note that typical AlAs grows uses temperatures about 620° C. and typical InGaAs growth uses temperatures about 550° C. Then heat the effusion cells to operating temperatures. These temperatures will be maintained throughout the growth, although in other embodiments controller 206 could also adjust the effusion cell temperatures to adjust the beam fluxes.

(c) Once the effusion cells are at operating temperatures (which will be detected by mass spectrometer due to the leakage of effusion cell shutters), controller 206 starts the growth by simultaneously opening the arsenic, indium, and gallium effusion cell shutters. The arsenic effusion cell operating temperature provides a beam flux about 1000 times greater than the fluxes of the other effusion cells at operating temperates. The indium and gallium effusion cell operating temperatures are set to provide an indium to gallium beam flux ratio of 53 to 47 (so the InGaAs grown will always be $In_{0.53}Ga_{0.47}As$). This operating temperature setting derives from a calibration as described later. The indium and gallium effusion cell shutters will remain open about 250 seconds; see the lefthand portion of FIG. 4 which illustrates the indium, gallium, and aluminum signals from mass spectrometer 204 during growth. These signals have the units of amps, and the indium and gallium effusion cell shutters open at a time of about 80 seconds in FIG. 4. Note that the indium and gallium signals decay from their initial levels and asymptotically approach steady levels. This decay may be from flux transients due to overheating of the indium and gallium melts in the effusion cells during shutter closure and illustrates the nonuniformity inherent in MBE growth.

Figure 4:
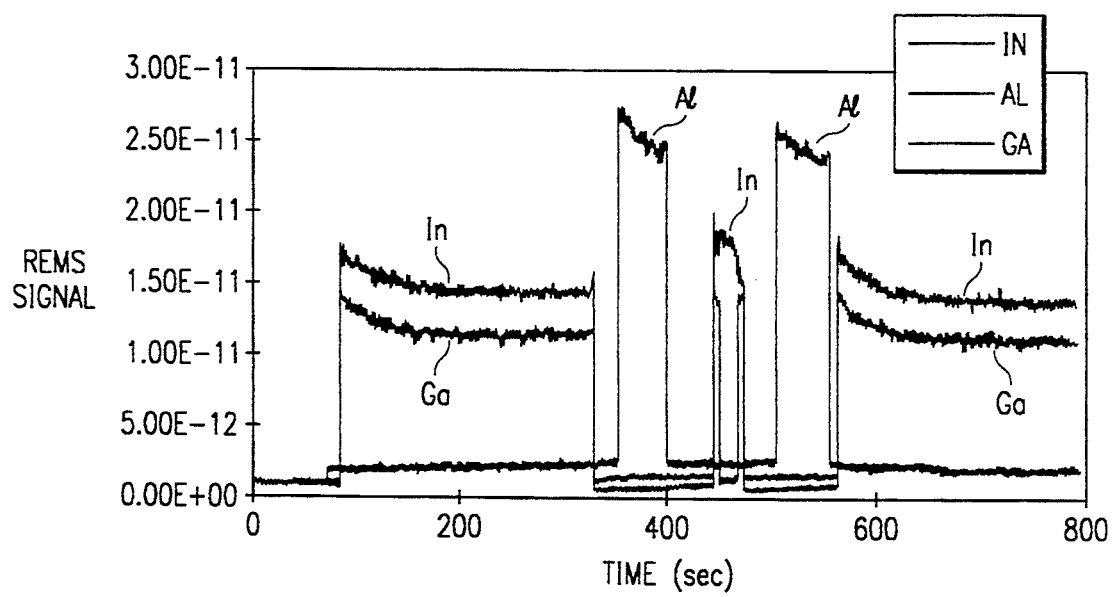
FIG. 4 shows mass spectrometer signals during growth.

(d) Controller 206 receives the indium and gallium signals as in FIG. 4 from mass spectrometer and integrates them in time. Once the integrated indium signal reaches $3.6 \times 10^{-9}$ amp-sec or the integrated gallium signal reaches $2.9 \times 10^{-9}$ amp-sec, controller 206 simultaneously closes both the indium and gallium effusion cell shutters. FIG. 4 indicates this by the drop of the indium and gallium signals at a time of about 320 seconds. These integrated signal levels derive from the desired thickness of the InGaAs layer (50 nm) plus a calibration described later. Thus the program loaded into controller 206 would have the 50 nm thickness plus the conversion factor of nm to amp-sec from the calibration as entered data, and controller 206 would generate the $3.6\times10^{-9}$ amp-sec and the $2.9\times10^{-9}$ amp-sec shutter closings. Also, if the integrated indium signal reaches $3.6\times10^{-9}$ amp-sec while the integrated gallium signal remains well below $2.9\times10^{-9}$ amp-sec, then most likely the effusion cells or the mass spectrometer are not working properly, and controller 206 can generate an error message.

(e) After closing the indium and gallium effusion cell shutters, controller 206 pauses for about 25 seconds in order to allow for surface smoothing through diffusion. Then controller 206 opens the aluminum effusion cell shutter to begin the growth of the 2 nm thick AlAs tunneling barrier. Again, controller 206 has as programmed data a desired thickness (2 nm) and a conversion factor from nm to amp-sec for AlAs growth as derived from a calibration. Thus controller again computes a shutter closing ($1.0\times10^{-8}$ amp-sec) and integrates the aluminum signal. When the integrated aluminum signal reaches the shutter closing level, controller closes the aluminum effusion cell shutter, and the aluminum signal drops. In FIG. 4 the aluminum effusion cell shutter opening occured at about 350 seconds and the closing at about 390 seconds.

(f) After closing the aluminum effusion cell shutter, controller 206 again pauses for about 40 seconds and then opens both the indium and gallium effusion cell shutters to begin the growth of the 0.5 nm thick InGaAs cladding layer. Again, controller 206 has as programmed data a desired thickness (0.5 nm) and the previously used conversion factor from nm to amp-sec for InGaAs growth. Thus controller 206 again computes a shutter closing and integrates the indium and gallium signals. When the integrated indium or gallium signal reaches the shutter closing level, controller 206 closes only the gallium effusion cell shutter, and the gallium signal drops while the indium effusion cell remains open, InAs growth begins, and the indium signal remains high (and nonuniform). In FIG. 4 the gallium effusion cell shutter opening occured at about 440 seconds and the closing at about 445 seconds.

Controller 206 restarts integrating the indium signal and has computed an amp-sec level for a gallium effusion cell shutter reopening based on the desired InAs thickness (4 nm) and an InAs growth conversion factor derived from a calibration. Once the amp-sec level indicates a 4 nm thick InAs layer, controller reopens the gallium effusion cell shutter while the indium effusion cell shutter remains open. Controller 206 again has computed integrated indium and gallium signal levels (the same as previously used due to the same cladding thickness) for closing the indium and gallium effusion cell shutters, and restarts integrating the indium signal plus starts integrating the gallium signal. When a shutter closing level is reached, controller 206 closes both indium and gallium effusion cell shutters. The reopening of the gallium effusion cell shutter occurred at about 465 seconds in FIG. 4 and the closing of both shutters occured at about 470 seconds.

(g) Controller 206 essentially repeats step (e) to grow the second AlAs layer and repeats the first portion of step (f) to grow the top InGaAs layer. This completes the layered structure needed to form the resonant tunneling diode of FIG. 3.

Figure 5:
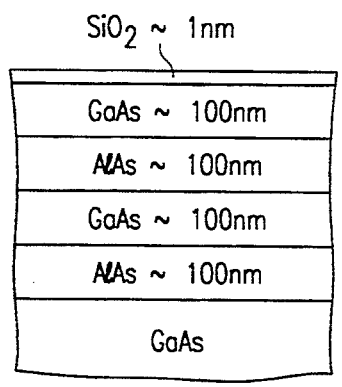
FIG. 5 illustrates a test structure.
Figure 6:
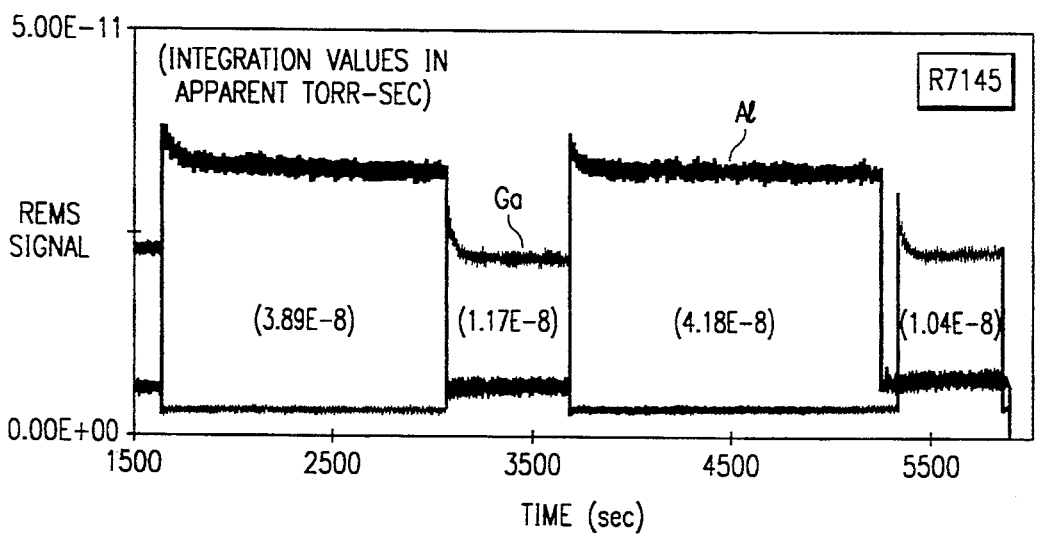
FIGS. 6–7 show characteristics of the test structure.
Figure 7:
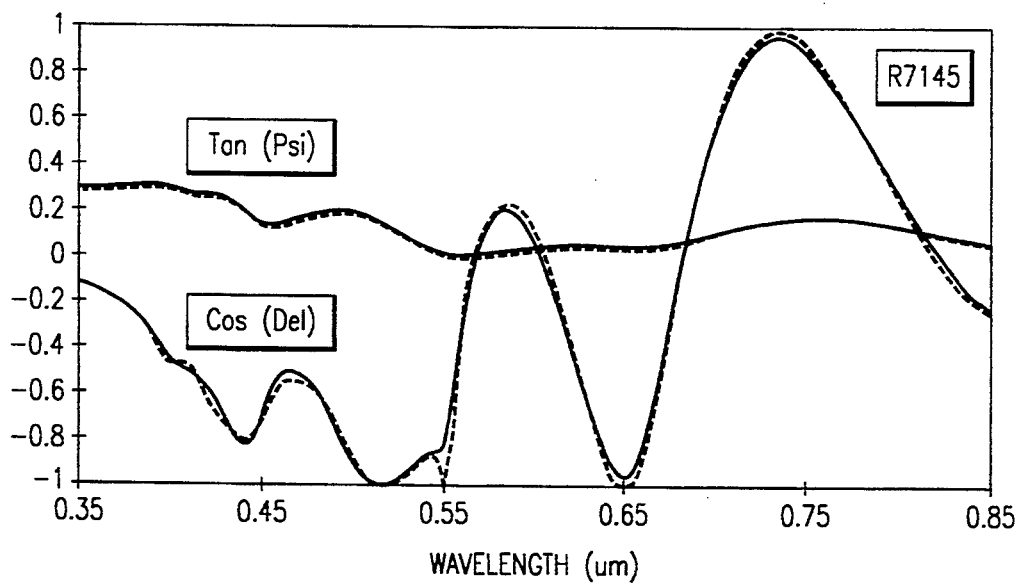

The conversion factors of layer thickness to integrated signal derive from calibrated growths as follows. To determine, for example, the conversion factor for AlAs growth, perform analogs of the steps (a)-(g) with the same operating temperatures, but with preset amp-sec levels for shutter openings and closings, and grow a simple test structure such as the four-layer AlAs and GaAs structure illustrated in FIG. 5. FIG. 6 shows the mass spectrometer signals during the growth. The thicknesses of the layers are chosen to make the analysis simple. The preset amp-sec levels are guesses which will give roughly the desired thicknesses. Then once the structure has been grown, remove it from the MBE system and analyze the layer thicknesses by ellipsometry or transmission electron microscopy (TEM). For example, FIG. 7 shows ellipsometry measurements. These ex situ measurements then provide the conversion factor from nm to amp-sec for AlAs growth by comparing the measured thicknesses with the preset amp-sec levels used to grow the structure.

Overpressure Signal

Figure 8:
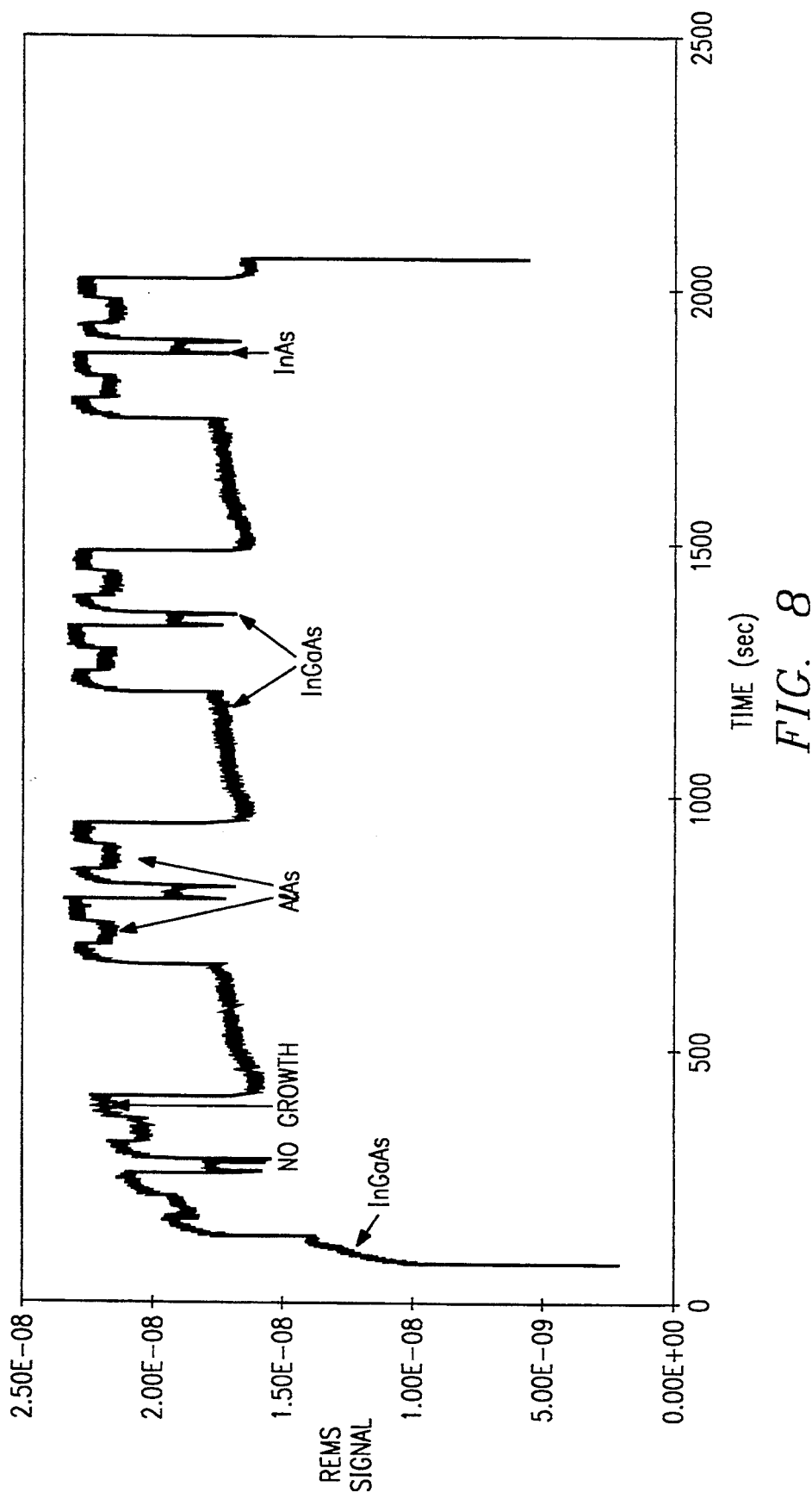
FIG. 8 shows a mass spectrometer signal during growth.

During growth with the preceding example, MBE system 200 maintains an arsenic overpressure and mass spectrometer 204 generates an arsenic signal. This signal indicates layer growth as shown in FIG. 8 by decreasing due to arsenic reacting with indium, gallium, or aluminum when available. Integration of the signal decreases would provide the same sort of information as the integration of the indium, gallium, and aluminum signals. But the arsenic signal greatly exceeds these other signals and its drift and apparently longer time constant on changes imply less accuracy with its use. Note that FIG. 8 shows the growth of layers for a stack of four resonant tunneling diodes with each diode having essentially the same layers as that of FIG. 3.

Modifications and Advantages

The preferred embodiments may be varied in many ways while retaining one or more of the features of MBE layer thickness control based on real time feedback using integrated growth species signals and the use of integrated signals of multiple growth species for multiple layers and growth of different compounds at the same temperature and opening or closing an effusion cell shutter to change the compound being grown while other effusion cells shutters remain open.

For example, layers could be grown over nonplanar features on the wafer and the integrated signals would still provide thickness control, whereas alternative thickness measurement approaches such as ellipsometry have problems with nonplanar layers. Other growth temperatures could be used. Other size and material wafers could be used, including semiconductor-on-insulator wafers. Other material layers could be grown such as silicon dioxide or calcium fluoride on silicon or III-V semiconductor compounds using phosphorus rather than arsenic and with a phosphorus overpressure or $Hg_{1-x}Cd_xTe$ on CdTe or other II-VI compounds with a mercury overpressure. Layer thicknesses of quarternary compounds such as InAlGaAs may also be controlled with the same integrated signals. Also, some of the steps, such as the intial wafer mounting, wafer cleaning, controller programming, and so forth, may be omitted or replaced with other analogous steps. The MBE system could omit or include other diagnostic tools such as RHEED, ellipsometry, pyrometry, et cetera.

The feedback control for growing desired layer thicknesses has an advantage of accuracy despite variation in growth rates; plus the mass spectrometer may be fit in an effusion cell opening of an MBE chamber, so retrofitting existing MBE systems may be easily accomplished.

What is claimed is:

1. A method of molecular beam epitaxy layer growth, comprising the steps of:
   (a) directing a first beam of growth species at a wafer in a growth chamber;
   (b) repeatedly measuring the flux of the reflection of said first beam from said wafer;
   (c) integrating the flux measurements, from measuring the flux of the reflection of said first beam from said wafer over time; and
   (d) terminating said first beam when the integrated flux measurements reaches a first level.

2. The method of claim 1, wherein:
   (a) said measuring the flux is by a mass spectrometer.

3. The method of claim 1, wherein:
   (a) said wafer has a nonplanar surface.

4. The method of claim 1, further comprising:
   (a) after said terminating of step (d) of claim 1, directing a second beam of growth species at said wafer, said second beam of said growth species being different from said first beam of said growth species;
   (b) repeatedly measuring the flux of the reflection of said second beam from said wafer;
   (c) integrating the flux measurements from step (b) over time;
   (d) terminating said second beam when the integrated flux measurements from step (c) reaches a second level.

5. The method of claim 4, wherein:
   (a) the temperature of said wafer remains essentially constant both when first beam and when said second beam are directed at said wafer.

6. The method of claim 4, wherein:
   (a) said wafer is made of a III-V semiconductor compound;
   (b) said first beam includes atoms of a first Group III element; and
   (c) said second beam includes atoms of a second Group III element.

7. A method of molecular beam epitaxy stacked layer growth, comprising the steps of:
   (a) providing sources for $B_1, B_2, \ldots B_N$, where $B_J$ is a beam of a Jth growth species and N is a positive integer greater than two and said Jth growth species differ from each other;
   (b) directing a first subset of $B_1, B_2, ,,, B_N$ at a wafer in a growth chamber;
   (c) repeatedly measuring the fluxes of the reflection of at least one of said first subset of beams from said wafer;
   (d) integrating the flux measurements from measuring the fluxes of the reflection of said at least one of said first subset of beams for said wafer over time;
   (e) changing to a second subset of said $B_1, B_2, ,,, B_N$ directed at said wafer when an integrated flux measurement reaches a first level, where said first and second subsets have at least two beams in common;
   (f) repeatedly measuring the flux of the reflection of at least one of said second subset of beams from said wafer beginning with said change to said second subset of said $B_1, B_2, ,,, B_N$;
   (g) integrating the flux measurements of said second subset over time; and
   (h) changing to a third subset of said $B_1, B_2, ,,, B_N$ when the integrated flux measurements reaches a second level.

8. The method of claim 7, wherein:
   (a) said Jth growth species are of III-V semiconductor compound precursors.

9. The method of claim 8, wherein:
   (a) one of said two beams in common of step (e) of claim 7 includes arsenic.

10. The method of claim 7, wherein:
    (a) said third subset is empty.

11. The method of claim 7, wherein:
    (a) said third subset is the same as said first subset.

* * * * *